United States Patent
Moosburger

(10) Patent No.: US 9,530,951 B2
(45) Date of Patent: Dec. 27, 2016

(54) OPTOELECTRONIC DEVICE

(71) Applicant: OSRAM Opto Semiconductors GmbH, Regensburg (DE)

(72) Inventor: Juergen Moosburger, Lappersdorf (DE)

(73) Assignee: OSRAM OPTO SEMICONDUCTOR GMBH, Regensburg (DE)

( * ) Notice: Subject to any disclaimer, the term of this patent is extended or adjusted under 35 U.S.C. 154(b) by 0 days.

(21) Appl. No.: 14/784,945

(22) PCT Filed: Apr. 10, 2014

(86) PCT No.: PCT/EP2014/057300
§ 371 (c)(1),
(2) Date: Oct. 15, 2015

(87) PCT Pub. No.: WO2014/170211
PCT Pub. Date: Oct. 23, 2014

(65) Prior Publication Data
US 2016/0056358 A1 Feb. 25, 2016

(30) Foreign Application Priority Data
Apr. 15, 2013 (DE) ......................... 10 2013 103 760

(51) Int. Cl.
| H01L 33/00 | (2010.01) |
| H01L 33/64 | (2010.01) |
| H01L 33/48 | (2010.01) |
| H01L 33/62 | (2010.01) |

(52) U.S. Cl.
CPC .......... *H01L 33/641* (2013.01); *H01L 33/486* (2013.01); *H01L 33/62* (2013.01); *H01L 2224/48091* (2013.01); *H01L 2224/48464* (2013.01); *H01L 2933/0033* (2013.01); *H01L 2933/0066* (2013.01); *H01L 2933/0075* (2013.01)

(58) Field of Classification Search
CPC ....................................................... H01L 33/641
USPC ............................................................ 257/99
See application file for complete search history.

(56) References Cited

U.S. PATENT DOCUMENTS

| 2004/0079957 | A1 | 4/2004 | Andrews et al. |
| 2005/0280017 | A1 | 12/2005 | Oshio et al. |
| 2006/0124953 | A1 | 6/2006 | Negley et al. |
| 2015/0048400 | A1 | 2/2015 | Gootz et al. |
| 2015/0228870 | A1 | 8/2015 | Goeoetz et al. |

FOREIGN PATENT DOCUMENTS

| DE | 102010034924 A1 | 2/2012 |
| KR | 1020090072226 | 3/2010 |
| KR | 1020110030257 | 2/2012 |
| WO | WO-2013167567 A1 | 11/2013 |
| WO | WO-2014032938 A1 | 3/2014 |

OTHER PUBLICATIONS

Heo, et al., "Enhanced heat transfer by room temperature deposition of AlN film on aluminum for a light emitting diode package", Applied Thermal Engineering No. 50, 2013, pp. 799-804.

*Primary Examiner* — Anthony Ho
(74) *Attorney, Agent, or Firm* — McDermott Will & Emery LLP

(57) ABSTRACT

A method for producing an optoelectronic device comprises steps for providing a package with a first surface and a second surface, wherein an electrically conductive chip carrier is embedded in the package and is accessible at the first surface and at the second surface, and for applying an insulation layer on the second surface of the package by means of aerosol deposition.

12 Claims, 3 Drawing Sheets

OPTOELECTRONIC DEVICE

The present invention relates to a method for producing an optoelectronic device according to claim 1 and to an optoelectronic device according to claim 11.

Optoelectronic devices with high power consumption, for example high-power light-emitting diodes, are known to generate elevated waste heat outputs. It is conventional to provide such optoelectronic devices with thermal contact areas, which serve to dissipate the waste heat. Such thermal contact areas consist of an electrically conductive material and are frequently connected electrically conductively with a potential of an optoelectronic semiconductor chip of the optoelectronic device. For many applications it would however be favorable for the thermal contact area of an optoelectronic device to be potential-free.

It is known to provide optoelectronic devices with ceramic packages, in order to provide a potential-free thermal contact area. Such ceramic packages are associated with high costs, however.

A method is known from the prior art for aerosol deposition of ceramic material. In this case, ceramic material is applied in the form of powder with particle sizes of, for example, a few micrometers in a gas stream with a particle velocity of, for example, 100 m/s to 500 m/s.

One object of the present invention consists in providing a method for producing an optoelectronic device. A further object of the present invention consists in providing an optoelectronic device.

In a method for producing an optoelectronic device, steps are performed for providing a package with a first surface and a second surface, wherein an electrically conductive chip carrier is embedded in the package and is accessible at the first surface and at the second surface. The term "embedded" may here and hereinafter mean that the package has a recess in which the electrically conductive chip carrier is located. In other words, the electrically conductive chip carrier is enclosed on at least two sides by the package. In addition, the term "accessible" may here and hereinafter mean that the first and second surfaces are each free, at least in places, of an electrically insulating material, for example, of the package. At these places electrical contacting of the first and/or second surface may take place.

In addition, steps are performed for applying an insulation layer to the second surface of the package by means of aerosol deposition. A layer applied by means of aerosol deposition may in particular comprise an electrically insulating material, which has been deposited in the form of particles. In particular, a layer applied by means of aerosol deposition may be a high-density and simultaneously thin ceramic layer. Using an aerosol deposition method it is thus possible to provide a thin, electrically insulating insulation layer which, due to its small thickness, increases the heat resistance of the optoelectronic device only marginally.

Using the aerosol deposition method, the insulation layer may be produced with desired properties through a purposeful selection of the material or materials of the particles, the particle size distribution and the process conditions. Compared with conventional coating methods, such as, for instance, vacuum evaporation, chemical vapor deposition, sputtering or ion plating, the aerosol deposition method makes possible qualitatively and quantitatively efficient application of the material of the electrically insulating insulation layer in the form of an unpatterned or patterned layer. In comparison with sintering methods, in which conventionally dispersant-containing pastes with the desired material particles are applied, in the aerosol deposition method it is possible to dispense with the liquid dispersants. The aerosol deposition method may thus offer greater efficiency and greater processability for producing the electrically insulating insulation layer as compared with methods conventional to semiconductor technology.

Advantageously, in an optoelectronic device produced according to this method a thermal contact area may be insulated electrically by the insulation layer relative to the electrically conductive chip carrier, whereby the thermal contact area is potential-free. The insulation layer may here advantageously bring about only a minimal increase in heat resistance. The method may advantageously be inexpensively performed. In particular, application of the insulation layer may be carried out inexpensively using aerosol deposition. Application of the insulation layer may advantageously take place at a high processing speed, which allows mass production.

In one embodiment of the method, the insulation layer comprises a ceramic material. Advantageously, the insulation layer may thereby be applied with high electrical breakdown strength and good thermal conductivity.

In one embodiment of the method, the insulation layer comprises $Al_2O_3$ (aluminum oxide). Advantageously, $Al_2O_3$ can be obtained inexpensively and exhibits favorable mechanical, thermal and electrical characteristics.

In one embodiment of the method, a shadow mask or a stencil is used on application of the insulation layer. In this way, the insulation layer may advantageously be applied with openings, which allow electrical contacting of the second surface of the package of the optoelectronic device. Advantageously, no further process steps are necessary for forming the openings, whereby the method can be simply and inexpensively performed.

In one embodiment of the method, the insulation layer is applied with a thickness of between 1 μm and 20 μm. The insulation layer may preferably have a thickness of at most 10 μm. Advantageously, the insulation layer then has sufficient breakdown strength. A further advantage consists in being able to apply such a thin insulation layer within a very short processing time. A further advantage consists in the fact that an insulation layer of such thinness brings about only a slight increase in thermal resistance.

In one embodiment of the method, the latter comprises an additional step of applying a metallization to portions of the insulation layer and the second surface. The metallization may here serve to produce electrical and thermal contact areas. Advantageously, in an optoelectronic device produced according to this method a thermal contact area formed by a portion of the metallization may be insulated electrically by the insulation layer relative to the electrically conductive chip carrier, whereby the thermal contact area is potential-free.

In one embodiment of the method, a seed layer is applied to the insulation layer and the second surface for application of the metallization. The metallization is then electrodeposited on the seed layer. This advantageously enables rapid and inexpensive application of the metallization.

In one embodiment of the method, the metallization is patterned by partial removal of the metallization. Advantageously, the metallization may thereby be subdivided into different area portions, which are electrically insulated from one another.

In one embodiment of the method, the latter comprises an additional step of arranging an optoelectronic semiconductor chip on the first surface of the package, such that an electrically conductive connection arises between the optoelectronic semiconductor chip and the chip carrier. Advantageously, the optoelectronic semiconductor chip arranged on the first surface may then be contacted electrically via the chip carrier.

In one embodiment of the method, the package is provided with an electrically conductive contact embedded in the package which is accessible at the first surface and at the second surface. Advantageously, the electrically conductive contact embedded in the package may then provide a further electrically conductive connection to the optoelectronic semiconductor chip.

In one embodiment of the method, the latter has an additional step for producing an electrically conductive connection between the optoelectronic semiconductor chip and the contact. Advantageously, the optoelectronic semiconductor chip may then be electrically contacted at the second surface of the package of the optoelectronic device via the embedded contact.

An optoelectronic device comprises a package with a first surface and a second surface. An electrically conductive chip carrier is in this case embedded in the package and accessible at the first surface and at the second surface. An optoelectronic semiconductor chip is arranged on the first surface of the package. There is an electrically conductive connection between the optoelectronic semiconductor chip and the chip carrier. A ceramic insulation layer is arranged at the second surface of the package. Advantageously, in this optoelectronic device a thermal contact area may be insulated by the insulation layer electrically relative to the chip carrier embedded in the package and thus also relative to the optoelectronic semiconductor chip, connected electrically conductively with the chip carrier, of the optoelectronic device. The thermal contact area is thereby potential-free. Due to the high electrical breakdown strength of ceramic material, the ceramic insulation layer may advantageously have a small layer thickness and nevertheless a sufficiently high electrical breakdown strength. The ceramic insulation layer in this case increases thermal resistance only to a slight extent.

In one embodiment of the optoelectronic device, the insulation layer has a thickness of between 1 µm and 20 µm. The insulation layer may preferably have a thickness of at most 10 µm. Advantageously, the insulation layer then has a high electrical breakdown strength and a high thermal conductivity.

In one embodiment of the optoelectronic device, a metallization is arranged on portions of the insulation layer and of the second surface. Advantageously, in this optoelectronic device a thermal contact area may be formed by a portion of the metallization. The thermal contact area is in this case electrically insulated by the ceramic insulation layer relative to the chip carrier embedded in the package and thus also relative to the optoelectronic semiconductor chip, connected electrically conductively with the chip carrier, of the optoelectronic device. The thermal contact area formed in the metallization is thereby potential-free. Electrical contact areas of the optoelectronic device may moreover also be formed by portions of the metallization.

In one embodiment of the optoelectronic device, a first area portion of the metallization is in electrically conductive connection with the chip carrier. A second area portion of the metallization is insulated relative to the chip carrier by the insulation layer. In this case, the first area portion and the second area portion are insulated electrically relative to one another. Advantageously, the first area portion of the metallization may then serve for electrical contacting of the optoelectronic semiconductor chip of the optoelectronic device. The second area portion of the metallization may serve as a thermal contact area for dissipating from the optoelectronic device waste heat produced by the optoelectronic semiconductor chip. The thermal contact area is in this case advantageously potential-free.

In one embodiment of the optoelectronic device, an electrically conductive contact is embedded in the package and accessible at the first surface and at the second surface. In this case, there is an electrically conductive connection between the optoelectronic semiconductor chip and the contact. Moreover, a third area portion of the metallization is in electrically conductive connection with the contact. Advantageously, the third area portion of the metallization may likewise then serve for electrical contacting of the optoelectronic semiconductor chip of the optoelectronic device.

In one embodiment of the optoelectronic device, a recess is formed in the first surface of the package. In this case, the optoelectronic semiconductor chip is arranged at the base of the recess. Advantageously, the optoelectronic semiconductor chip is protected from mechanical damage at the base of the recess. Moreover, walls of the recess may advantageously serve as optical reflectors of the optoelectronic device. The recess may advantageously also serve to accommodate a converter material for wavelength conversion or for mounting an optical lens.

The above-described characteristics, features and advantages of this invention and the manner in which these are achieved will become clearer and more distinctly comprehensible from the following description of the exemplary embodiments, which are explained in greater detail in connection with the drawings, in which in each case in a schematic representation:

FIG. 1 is a schematic sectional representation of a package 100 of an optoelectronic device in a first processing state during production of the optoelectronic device. The optoelectronic device may, for example, be a light-emitting diode device, in particular a high-power light-emitting diode device.

Figure 1:
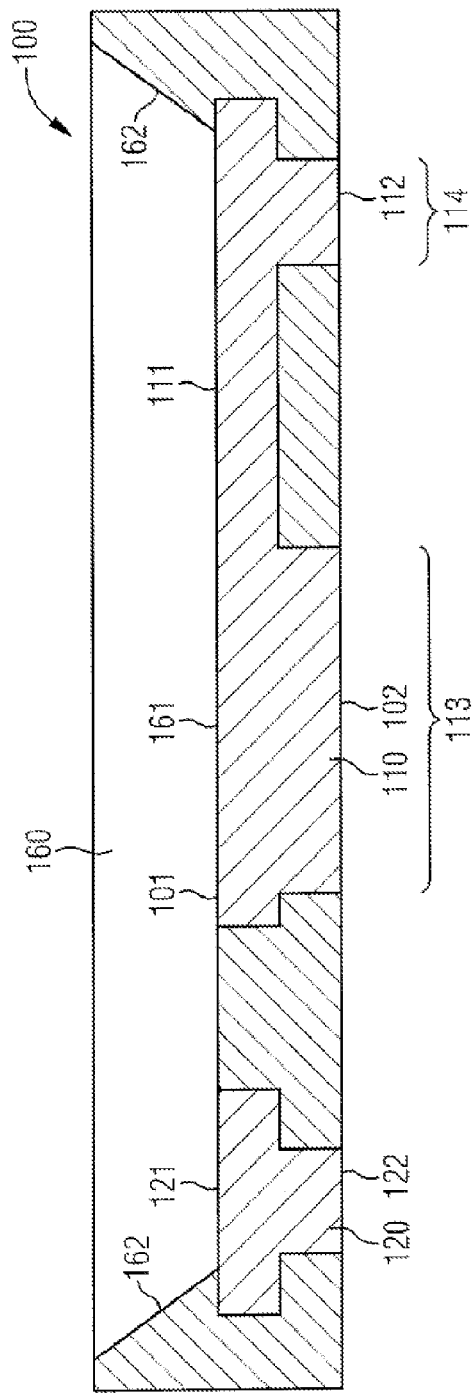
FIG. 1 shows a section through a package of an optoelectronic device in a first processing state.

The package 100 comprises a first surface 101 and a second surface 102 opposite the first surface 101. The package 100 consists in part of an electrically insulating material, for example a molding material, for instance an epoxide. The package 100 is preferably produced by injection molding or transfer molding or another molding process.

A chip carrier 110 is embedded in the package 100. The chip carrier 110 may also be designated as a first leadframe. The chip carrier 110 comprises an electrically and thermally highly conductive material, preferably a metal. For example, the chip carrier 110 may comprise copper. The chip carrier 110 comprises a top 111 and a bottom 112 opposite the top 111. The chip carrier 110 is embedded in the package 100 in such a way that the top 111 of the chip carrier 110 is accessible at the first surface 101 of the package 100. At the same time, the bottom 112 of the chip carrier 110 is accessible at the second surface 102 of the package 100. The chip carrier 110 is preferably embedded in the package 100 as early as during production of the package 100 by encapsulating the chip carrier 110 in the material of the package 100 by injection molding or potting.

The bottom 112 of the chip carrier 110 comprises a first portion 113 and a second portion 114. The first portion 113 and the second portion 114 are next to one another in the lateral direction. The first portion 113 and the second portion 114 may be delimited from one another by patterning of the bottom 112 of the chip carrier 110 in such a way that a portion of the material of the package 100 is arranged between the first portion 113 and the second portion 114. The first portion 113 and the second portion 114 may however also be directly contiguous throughout. In any event, the first portion 113 and the second portion 114 are connected together electrically and thermally conductively by further parts of the chip carrier 110. The chip carrier 110 may overall have a simple cylindrical, for instance a circular cylindrical, geometry or a more complex geometry.

Furthermore, a contact 120 is embedded in the package 100. The contact 120 may also be designated as the second leadframe. The contact 120 comprises an electrically conductive material. The contact 120 may, for example, comprise the same material as the chip carrier 110. The contact 120 comprises a top 121 and a bottom 122 opposite the top 121. The contact 120 is embedded in the package 100 in such a way that the top 121 of the contact 120 is accessible at the first surface 101 of the package 100. At the same time, the bottom 122 of the contact 120 is accessible at the second surface 102 of the package 100. The contact 120 is preferably embedded in the package 100 at the same time as the chip carrier 110 is embedded in the package 100. The contact 120 may have a cylindrical, for instance a circular cylindrical, geometry or another geometry.

The package 100 has a recess 160 in its first surface 101. The recess 160 is bowl-shaped or crater-shaped. The recess 160 has a substantially flat base 161 in its central region, at which the top 111 of the chip carrier 110 and the top 121 of the contact 120 are accessible. The base 161 of the recess 160 is externally delimited by a peripheral wall 162, which is raised relative to the base 161. The wall 162 may be slanted such that the recess 160 becomes increasingly wide away from the base 161. In the plane of the first surface 101 of the package 100, the recess 160 may, for example, be rectangular or take the form of a circular disc.

Figure 2:
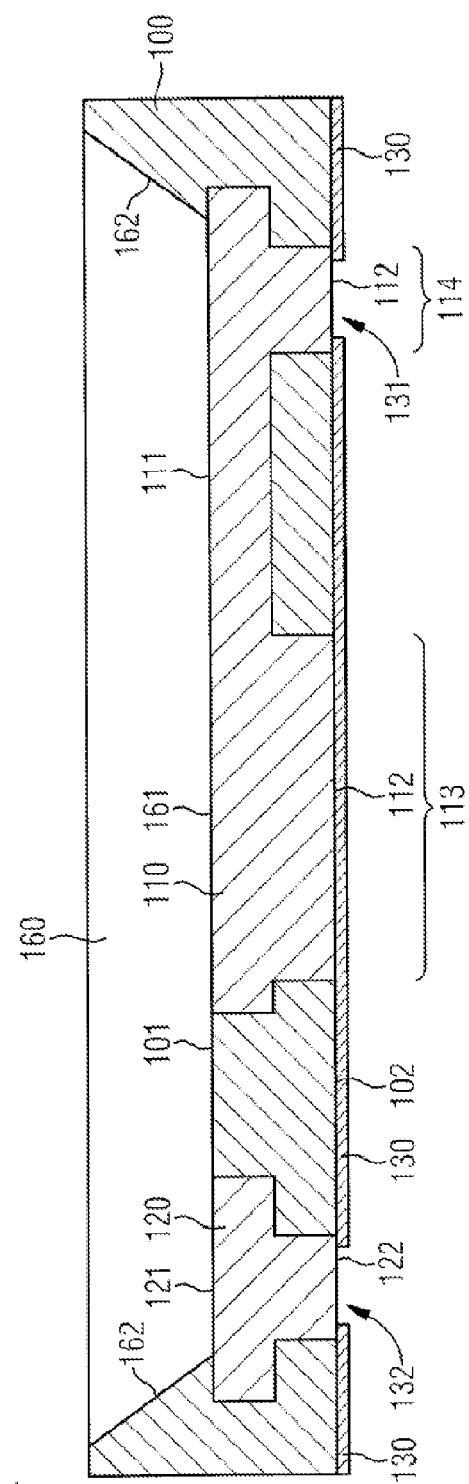
FIG. 2 shows a section through the package of the optoelectronic device in a second processing state.

FIG. 2 shows a schematic sectional representation of the package 100 in a second processing state, which chronologically follows the first processing state of FIG. 1.

To achieve the second processing state, a patterned insulation layer 130 is applied to the second surface 102 of the package 100. The insulation layer 130 is flat and covers the second surface 102 of the package 100 substantially entirely. Nonetheless, the insulation layer 130 comprises a first opening 131 and a second opening 132. The first opening 131 in the insulation layer 130 is arranged in the region of the second portion 114 of the bottom 112 of the chip carrier 110 embedded in the package 100. The second portion 114 of the bottom 112 of the chip carrier 110 is thus accessible through the first opening 131 in the insulation layer 130. The second opening 132 is arranged in the region of the second surface 102 of the package, in which the bottom 122 of the contact 120 is accessible. The bottom 122 of the contact 120 is thus accessible through the second opening 132 in the insulation layer 130. The first portion 113 of the bottom 112 of the chip carrier 110 is covered by the insulation layer 130.

The insulation layer 130 comprises a ceramic material, which is electrically insulating. At the same time, the material of the insulation layer 130 preferably has high thermal conductivity. The insulation layer 130 may, for example, comprise $Al_2O_3$ (aluminum oxide). The thermal conductivity of the insulation layer 130 may amount, for example, to 25 W/mK.

The insulation layer 130 is applied to the second surface 102 of the package 100 by means of aerosol deposition. In this case, the material of the insulation layer 130 is applied in the form of powder with an average particle size of, for example, 2 μm in a gas stream with a particle velocity of, for example, 100 m/s to 500 m/s. The aerosol deposition method in this case allows deposition rates of several μm/min. The aerosol deposition method allows deposition of a layer with a thickness of up to 0.1 mm or more.

The insulation layer 130 is preferably deposited using a shadow mask or a stencil. The shadow mask or the stencil in this case shades those regions of the second surface 102 of the package 100 in which the first opening 131 and the second opening 132 in the insulation layer 130 are to be formed. In this way, the insulation layer 130 is applied in all regions of the second surface 102 of the package 100, apart from in the regions of the first opening 131 and the second opening 132.

In the growth direction, i.e. in the direction perpendicular to the second surface 102, the insulation layer 130 has a thickness of between 1 μm and 20 μm. Because of the high electrical breakdown strength of the ceramic material of the insulation layer 130, the insulation layer 130 effects sufficient electrical insulation with this thickness. Due to its small thickness, the insulation layer 130 additionally has only a low thermal resistance.

Figure 3:
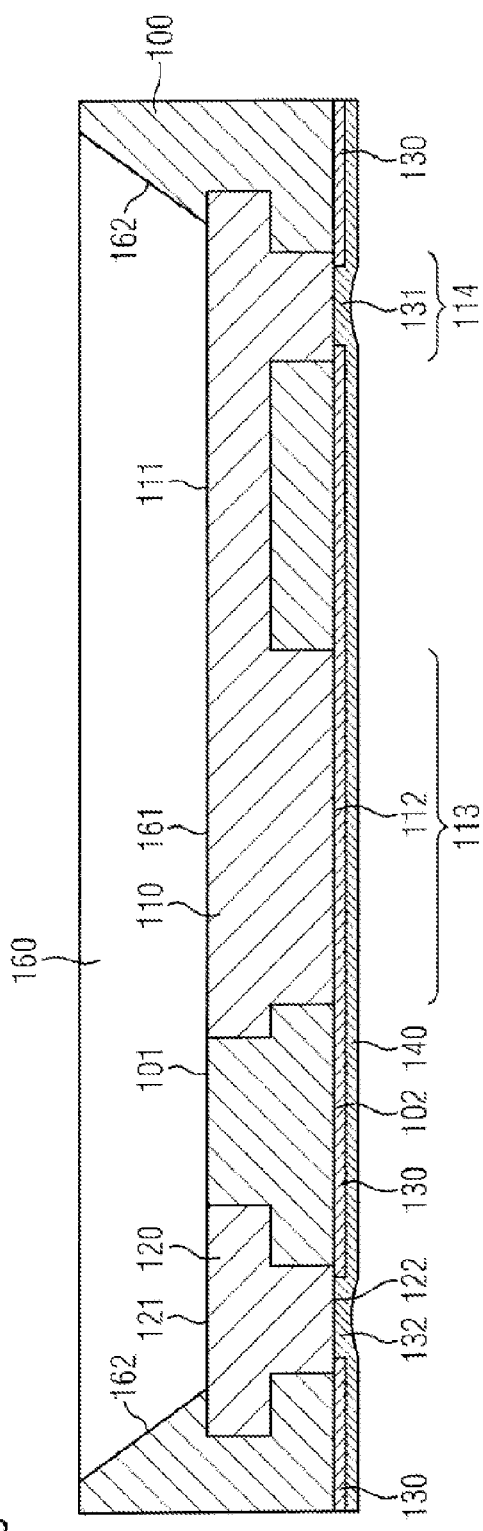
FIG. 3 shows a section through the package of the optoelectronic device in a third processing state.

FIG. 3 shows a schematic sectional representation of the package 100 in a third processing state, which chronologically follows the second processing state of FIG. 2.

To achieve the third processing state, a metallization 140 is applied to the insulation layer 130 and the parts of the second surface 102 not covered by the insulation layer 130. The parts of the second surface 102 not covered by the insulation layer 130 are located in the region of the first opening 131 in the insulation layer 130 and the second opening 132 in the insulation layer 130.

The metallization 140 comprises an electrically conductive material, for example a metal. The metallization 140 preferably comprises a material which is readily suited to producing soldered joints.

To apply the metallization, firstly a seed layer is applied to the insulation layer 130 and the second surface 102 of the package 100. The seed layer may be applied, for example, using the cathode sputtering method. Then the seed layer may be thickened by means of electrodeposition, in order to form the metallization 140. The metallization 140 may however also be applied using another method.

Figure 4:
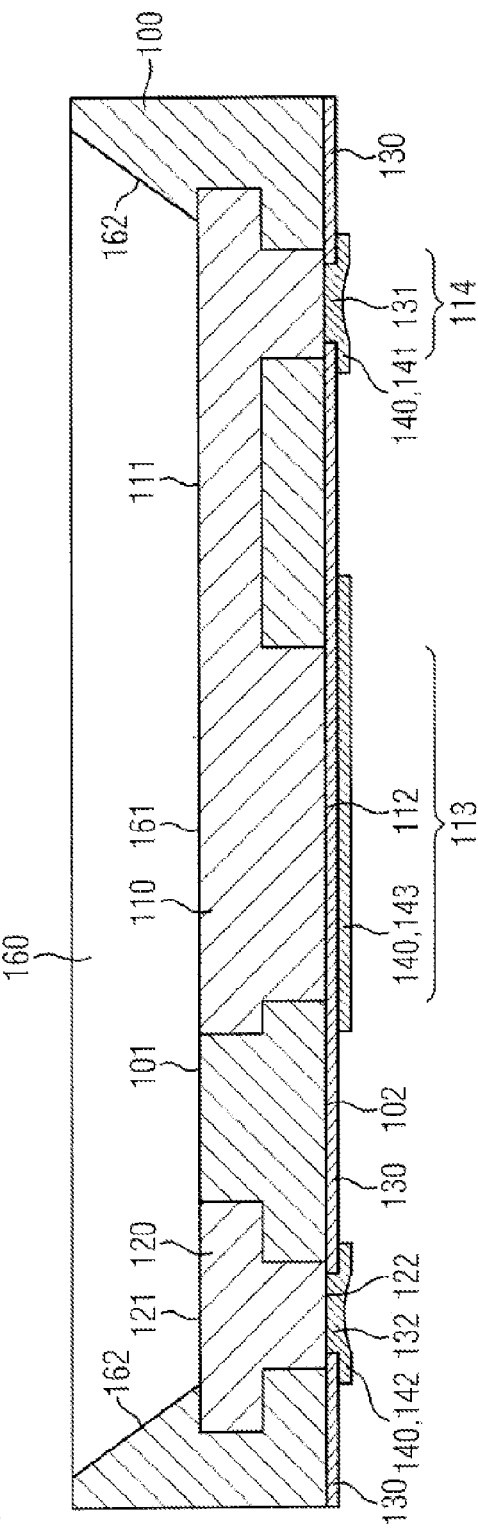
FIG. 4 shows a section through the package of the optoelectronic device in a fourth processing state.

FIG. 4 shows a schematic sectional representation of the package 100 in a fourth processing state, which chronologically follows the third processing state of FIG. 3.

To achieve the fourth processing state, the metallization 140 is patterned. The metallization may, for example, be patterned using lithographic methods and etching processes. When patterning the metallization 140, parts of the metallization 140 are removed. In this way, the metallization 140 is subdivided into area portions spaced laterally from one another. In the separating regions between the area portions, the metallization 140 is removed.

A first portion 141 of the metallization 140 remains in the region of the second portion 114 of the bottom 112 of the chip carrier 110. The first portion 141 of the metallization 140 is arranged in the region of the first opening 131 in the insulation layer 130. The first portion 141 of the metallization 140 is in electrically conductive connection with the chip carrier 110. A second portion 142 of the metallization 140 remains in the region of the bottom 122 of the contact 120 embedded in the package 100. The second portion 142 of the metallization 140 is arranged in the region of the second opening 132 in the insulation layer 130. The second portion 142 of the metallization 140 is in electrically conductive connection with the contact 120. A third portion 143 of the metallization 140 remains in the region of the portion 113 of the bottom 112 of the chip carrier 110. In this case, the insulation layer 130, which brings about electrical insulation of the third portion 143 of the metallization 140 relative to the chip carrier 110, is arranged between the third portion 143 of the metallization 140 and the bottom 112 of the chip carrier 110. The first portion 141, the second portion 142 and the third portion 143 of the metallization 140 are in each case insulated electrically relative to one another.

Figure 5:
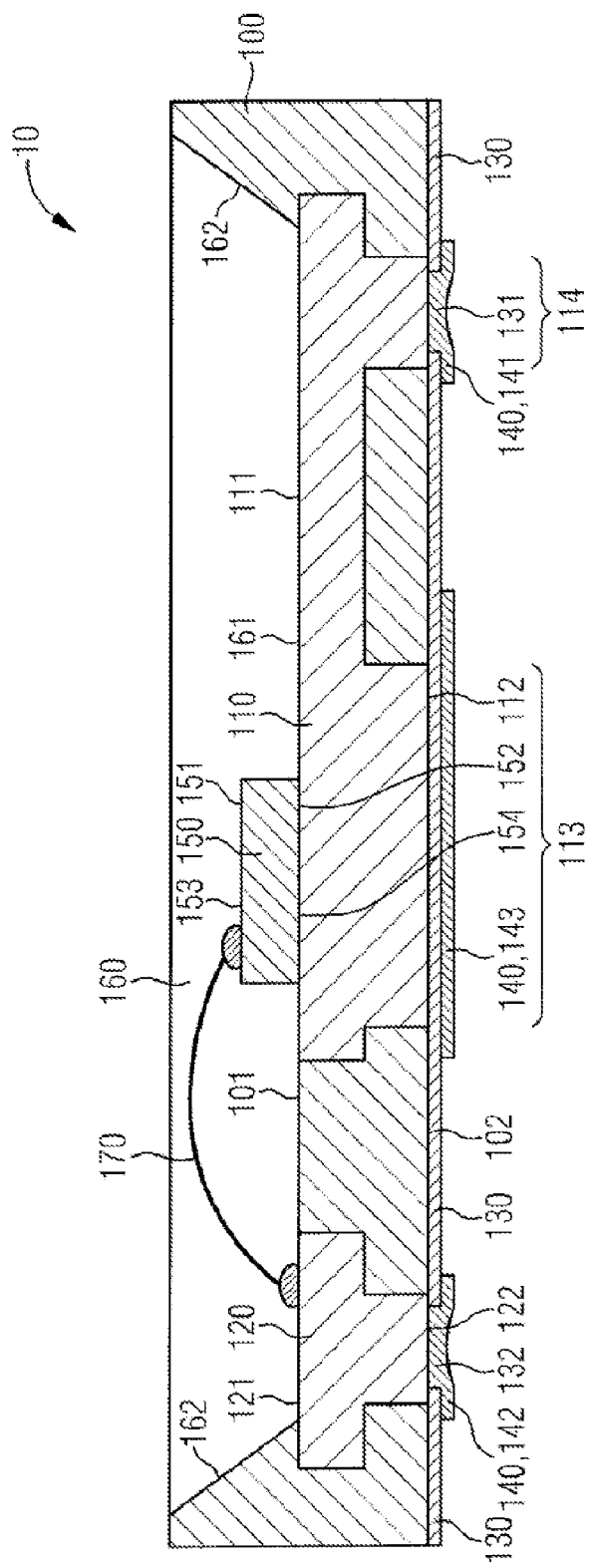
FIG. 5 shows a section through the optoelectronic device in a fifth processing state.

FIG. 5 shows a schematic sectional representation of the package 100 in a fifth processing state, which chronologically follows the fourth processing state of FIG. 4.

To achieve the fifth processing state shown in FIG. 5, an optoelectronic semiconductor chip 150 is arranged on the first surface 101 of the package 100. The package 100 and the optoelectronic semiconductor chip 150 together form an optoelectronic device 10. The optoelectronic semiconductor chip 150 may, for example, be a light-emitting diode chip (LED chip). The optoelectronic device 10 is then a light-emitting diode device. In particular, the optoelectronic semiconductor chip 150 may be an LED chip with high power consumption. The optoelectronic device 10 is then a high-power light-emitting diode device.

The optoelectronic semiconductor chip 150 comprises a first surface 151 and a second surface 152 opposite the first surface 151. A first electrical contact area 153 is arranged on the first surface 151 of the optoelectronic semiconductor chip 150. A second electrical contact area 154 is arranged on the second surface 152 of the optoelectronic semiconductor chip 150. Between the first electrical contact area 153 and the second electrical contact area 154, an electrical voltage may be applied to the optoelectronic semiconductor chip 150 in order to operate the optoelectronic semiconductor chip 150.

If the optoelectronic semiconductor chip 150 is an LED chip, the first surface 151 may form a radiation emission face of the optoelectronic semiconductor chip 150. If an electrical voltage is applied to the optoelectronic semiconductor chip 150 between the first electrical contact area 153 and the second electrical contact area 154, electromagnetic radiation, for example visible light, is generated in the optoelectronic semiconductor chip 150 and emitted by the radiation emission face formed by the first surface 151.

The optoelectronic semiconductor chip 150 is arranged in such a way on the first surface 101 of the package 100 that the second surface 152 of the optoelectronic semiconductor chip 150 faces the first surface 101 of the package 100. The optoelectronic semiconductor chip 150 is then arranged in the region of the top 111 of the chip carrier 110 accessible at the first surface 101 of the package 100, such that there is an electrically conductive connection between the second electrical contact area 154 arranged at the second surface 152 of the optoelectronic semiconductor chip 150 and the chip carrier 110.

An electrically conductive connection 170 is formed between the first electrical contact area 153 arranged on the first surface 151 of the optoelectronic semiconductor chip 150 and the top 121 of the contact 120. The electrically conductive connection 170 may, for example, be a bond connection formed by means of a thin wire (bonding wire).

The first portion 141 of the metallization 140 is thus connected electrically conductively via the chip carrier 110 to the second electrical contact area 154 of the optoelectronic semiconductor chip 150. The second portion 142 of the metallization 140 is connected electrically conductively via the contact 120 and the electrically conductive connection 170 with the first electrical contact area 153 of the optoelectronic semiconductor chip 150. Voltage may be applied to the optoelectronic semiconductor chip 150 via the first portion 141 and the second portion 142 of the metallization 140 on the bottom 102 of the package 100.

If the optoelectronic semiconductor chip 150 is operated by applying electrical voltage, the optoelectronic semiconductor chip 150 produces waste heat, which must be dissipated from the optoelectronic semiconductor chip 150 and the other parts of the optoelectronic device 10. The waste heat produced by the optoelectronic semiconductor chip 150 may flow into the chip carrier 110 and pass therefrom via the insulation layer 130 into the third portion 143 of the metallization 140. The waste heat of the optoelectronic semiconductor chip 150 may be further transported away from the third portion 143 of the metallization 140.

Because of its small thickness, the insulation layer 130 between the chip carrier 110 and the third portion 143 of the metallization 140 contributes only a small amount to the thermal resistance. If the insulation layer 130, for example, comprises $Al_2O_3$ with a thermal conductivity of 25 W/mK and a thickness of 5 µm, the insulation layer 130 increases the thermal resistance for an optoelectronic semiconductor chip 150, whose second surface 152 has an edge length of, for example, 1 mm, merely by around 0.2 K/W. In the case of a thickness of the insulation layer 130 of 2.5 µm, the additive contribution of the insulation layer 130 to the thermal resistance is reduced to around 0.1 K/W.

The first portion 141, the second portion 142 and the third portion 143 of the metallization 140 of the optoelectronic device 10 may be mounted on a carrier, for example, by means of a soldering method. For example, the portions 141, 142, 143 of the metallization 140 of the optoelectronic device 10 may be contacted by reflow soldering in accordance with a surface mount method (SMT).

Due to the insulation layer 130 arranged between the third portion 143 of the metallization 140 and the chip carrier 110, the third portion 143 of the metallization 140 is insulated electrically relative to the chip carrier 110 and is therefore advantageously not at the electric potential of the chip carrier 110.

The optoelectronic semiconductor chip 150 is arranged in the region of the base 161 of the recess 160 in the top 101 of the package 100. The wall 162 of the package 100 may serve, for example, as an optical reflector of the optoelectronic device 10. In this case, the wall 162 is preferably formed from an optically reflective material or coated with such a material. The wall 162 of the recess 160 may then serve to reflect radiation emitted by the first surface 151 of the optoelectronic semiconductor chip 150 towards the wall 162 of the recess 160 and thereby to focus the radiation emitted by the optoelectronic semiconductor chip 150.

The recess 160 of the optoelectronic device 10 may also serve to accommodate a wavelength-converting material which is provided for converting a wavelength of radiation emitted by the optoelectronic semiconductor chip 150. The wavelength-converting material may, for example, be embedded in a filler material arranged in the recess 160, for instance silicone. Alternatively, a filler material without wavelength-converting material may also be arranged in the recess 160.

The recess 160 may furthermore serve to mount an optical lens on the package 100 of the optoelectronic device 10.

In a simplified variant of the optoelectronic device 10 and of the explained method for the production thereof, it is possible to dispense with the application and patterning of the metallization 140. In this variant the optoelectronic device 10 may be arranged on a carrier which has thermal and electrical contact areas.

The optoelectronic device 10 is here arranged on the carrier in such a way that the thermal contact area of the carrier comes into contact with the insulation layer 130 in the region of the first portion 113 of the chip carrier 110. At the same time, the optoelectronic device 10 is arranged such that a first electrical contact area of the carrier is in electrically conductive connection with the chip carrier 110 through the first opening 131 in the insulation layer 130. Moreover, a second electrical contact area of the carrier is in electrically conductive connection with the contact 120 through the second opening 132 in the insulation layer 130.

The invention has been illustrated and described in greater detail with reference to the preferred exemplary embodiments. The invention is nevertheless not restricted to the disclosed examples. Rather, other variations may be derived therefrom by a person skilled in the art without going beyond the scope of protection of the invention.

The present application claims priority from German patent application DE 10 2013 103 760.7, the disclosure content of which is hereby included by reference.

The invention claimed is:

1. Method for producing an optoelectronic device having the following steps:
   providing a package with a first surface and a second surface, wherein an electrically conductive chip carrier is embedded in the package and is accessible at least in places at the first surface and at the second surface;
   applying an insulation layer to the second surface of the package by means of aerosol deposition.

2. Method according to claim 1, wherein the insulation layer comprises a ceramic material.

3. Method according to claim 1, wherein the insulation layer comprises $Al_2O_3$.

4. Method according to claim 3, wherein the thermal resistance of the optoelectronic device is increased by at most 0.2 K/W by the insulation layer.

5. Method according to claim 1, wherein a shadow mask or a stencil is used on application of the insulation layer.

6. Method according to claim 1, wherein the method comprises the following further step:
   applying a metallization to portions of the insulation layer and of the second surface.

7. Method according to claim 6, wherein a seed layer is applied to the insulation layer and to the second surface for application of the metallization, wherein the metallization is electrodeposited on the seed layer.

8. Method according to claim 1, wherein the metallization is patterned by partial removal of the metallization.

9. Method according to claim 1, wherein the method comprises the following further step:
   arranging an optoelectronic semiconductor chip on the first surface of the package, such that an electrically conductive connection arises between the optoelectronic semiconductor chip and the chip carrier.

10. Method according to claim 1, wherein the package is provided with an electrically conductive contact embedded in the package which may be contacted electrically at the first surface and at the second surface.

11. Method according to claim 1, wherein the method comprises the following further step:
    producing an electrically conductive connection between the optoelectronic semiconductor chip and the contact.

12. Method according to claim 1, wherein the chip carrier is a leadframe, wherein the package consists in part of an electrically insulating material, and wherein the package is produced by encapsulating the chip carrier in the material of the package by molding or potting.

* * * * *